United States Patent [19]

Mehl

[11] 4,134,676

[45] Jan. 16, 1979

[54] REPROGRAPHY PROCESS: COLOR-COPYING WITH SUBLIMABLE DYES

[75] Inventor: Wolfgang Mehl, Geneva, Switzerland

[73] Assignee: Sublistatic Holding S.A., Glaris, Switzerland

[21] Appl. No.: 813,159

[22] Filed: Jul. 5, 1977

[30] Foreign Application Priority Data

Jul. 9, 1976 [CH] Switzerland ............... 8810/76

[51] Int. Cl.$^2$ ............... G01J 3/40; D06P 5/00
[52] U.S. Cl. ............... 355/77; 8/2.5 A; 355/32
[58] Field of Search ............... 8/2.5 A; 355/77

[56] References Cited

U.S. PATENT DOCUMENTS

| | | | |
|---|---|---|---|
| 3,601,484 | 8/1971 | Dybvig et al. ............... | 355/4 |
| 3,963,341 | 6/1976 | Tully ............... | 355/4 |
| 4,017,176 | 4/1977 | Beguin et al. ............... | 355/32 |

FOREIGN PATENT DOCUMENTS 822753 5/1975 Belgium.
2328976 5/1977 France.

*Primary Examiner*—A. Lionel Clingman
*Attorney, Agent, or Firm*—Sprung, Felfe, Horn, Lynch & Kramer

[57] ABSTRACT

Process for color-copying a colored original which involves the color selections of said original, characterized (a) by photocopying and developing each of said color selections with developers containing dyestuffs which are sublimable or vaporizable between 130 and 230° C and which correspond to the photocopied color selection, (b) by transferring these copies successively by superposing its in registration onto an intermediary support, in order to reconstitute the inverse color image of the original, and (c) by righting said intermediate image by transferring in one heating-step on the final support and the color photocopies obtained by the process.

10 Claims, No Drawings

REPROGRAPHY PROCESS: COLOR-COPYING WITH SUBLIMABLE DYES

The Swiss patent application No. 13 778/75 relates to a reprographic device for making single — or multicolored copies which allows, with a photocopying apparatus provided with one objective, to obtain either the direct or the reverse image of an original. Said device is fitted with a mirror and a prism. Both the mirror or the prism can be interposed in the path of the light image after said image has gone through the lens or lenses of the objective.

That known device has especially the advantage that the image obtained on the copy support can be the inverse of the original. By transfer of said reverse image, onto the final copy support, a direct image of the original is thus obtained thereon. The applicant has developed a reproduction process involving sublimable or dispersable dyestuffs. According thereto a pattern containing such a vaponsable or sublimable dyestuff can be transferred onto an other support, if heared in contact with said support to a temperature which can at least sublime or vaporize the dyestuff. It is obvious that by such a transfer, the pattern is inversed onto the final support. Thus, a pattern is developed onto a first copy support (generally the recording support of the photocopying device) with a developer containing at least one transferable dyestuff.

It is than heated in contact with a further support and a reverse image of the developed pattern is obtained, which image is made only of dyestuffs. The other components which were present in the developer, such as resin for example, remain onto the first support.

An object of the present invention is a color reprography process, by which a direct image of the original is obtained, without the need of an optical device which differs from these equiping customarily the photocopying machines of the trade and which has to inverse the image.

The process of the invention is very artfully and ingenuous. It consits into a double transfer. The first transfer is effected with each of the copies developed from the latent images corresponding to the color selections of the original with developers containing transferable dyestuffs. These transfers are effected onto an intermediary support. These latent images and therefore also the copies obtained by developing them, are direct images of the original. By transfering successively in registration the images of all the color selections, a multicolored and inversed image of the original is thus obtained. The second transfer transporses said reconstructed inverse image onto the final support and rights it.

In the process of the present invention, the light image of the original is refracted through an objective onto the recording support. After development a direct image of one of the color selection of the original is obtained which contains dyestuffs subliming or vaporizing at temperatures ranging from 130 to 230° C. Said image is them transferred onto an intermediary support. This step is repeated for each color selection of the original, by superposing and making coincide in registration together all the successively transferred dyestuff images. An inverse true image of the original is thus obtained on the intermediary support and is transferred in only one transfer-step onto the final support by heating together both supports between 130 and 230° C.

It is thus possible to use in the present process the photocopying devices of the trade and to copy each of the color selections of an original by developing a latent image thereof with a developer containing dyestuffs which sublime or vaporize between 130 and 230° C. Suitable developers of that kind are known and disclosed, for example, in the Belgian Pat. No. 822 753.

The copies of the color selections are generally obtained and developed onto a recording support made of a paper sheet, for example onto zinc oxide paper. They are heated one after the others, whereby they are in contact with the intermediary support, to a temperature which can at least render transferable the dyestuffs contained into the developer. The dyestuff images are transferred by superposing them in registration onto said intermediary support and are thus giving an inversed and true reproduction of the original.

The intermediary support can be a plate or a sheet of a material which dissolves or has affinity for the used dyestuffs, for example a sheet, a film or a nonwoven made of synthetic material such as polyamides or acrylic resins. A sheet of paper can also be used, which has been sized, inpregnated or coated with such a material, for example polyethylene glycol, polystyrene, polyacrylonitrile and other acrylic resins, vinylic resins such as polyvinyl chloride or acetochloride or polyvinylidene chloride, polyamides, polyurethanes or epoxy resins. It is also possible to coate or to impregnate a sheet of paper with a solution of polyvinylalkohol or ethylcellulose which contains an adsorber for the used dyestuffs, such as, for example, silica or zinc oxyde or also ethylene or polyethyleneglycol. If polyvinylbutyrol or polyvinylformal is used for coating or impregnating the paper sheet, since these resins behave a too low retaining power for the used dyestuffs, an adsorber such as silica should also be used.

The copies of the color selections are transferred in a few seconds onto the intermediary support, for example in 5 to 20 seconds, at a temperature ranging from 120 to 200° C. The duration and the temperature can be varied so that the amount of transferred dyestuff can also vary an thus be regulated hat regulation allows, for example, to correct eventually the look of the final image.

The thus reconstituted inverse image of the original is transferred from the intermediary support to a final support. Although the intermediary support has affinity for the used dyestuff, the yield of that transfer is very high. Said transfer is effected by one heating-step, conducted at 180–230° C., for example in 20 to 60 seconds.

The advantages of the present invention are immediately visible, especially if the final support is a textile material or another material which hardly endures several heating-steps at 130–230° C., or which has a bad dimensional stability. Such a textile support would generally hardly bear several heating-steps conducted at 200° C. in order to transfer thereon all the copies of the color selections in order to reconstitute the multicolored original. Furthermore, since a textile support has a poor dimensional stability the reconstitution would be of bad quality because the single colored images, which correspond to each color selection, can hardly be brough into registration onto that kind of support. In the present process none registering is needed by the final transfer-step and it is easy to proceed to the intermediate transfers which require registering; since an intermediate support can be chosen which has a suitable rigidity. As that intermediate support, a material different of that of the final support will obviously be chosen, such as, for example, a material which has a power of retention or an affinity for the used dyestuff lower than the final support.

The non-limiting examples which follow illustrate the present invention. In these examples the parts and percentages are, unless stated otherwise, to be understood as being by weight and the temperatures as being in degrees centigrades.

EXAMPLE 1

A sheet of porous paper is impregnated with an aqueous solution containing 8% of polyethylene glycol with a molecular weight of about 400, and dried. Three copies corresponding to the color selections (yellow, magenta and cyan) of an original are obtained onto a photocopying device of the trade with developers containing the dyestuff no 64 of the Color Index* (yellow copy), 1-amino-2-phenoxy-4-hydroxyanthraquinone-magenta (red copy) and 1-amino-2-cyano-4-ethylamino-anthraquinone (cyan copy).

* the Color Index is edited by the Society of Dyers and Colourists, P.O. Box 244, 82 Grattan Road, Bradford, Yorkshire They are transferred successively onto the impregnated paper sheet whereby they are superposed in registration. The cyan copy is firstly transferred, than the yellow and there after the magenta copy, by heating during 15 seconds at 205°. These transfers are effected onto a customary press in which a good contact is achieved between the copies and the paper sheet. An inverse and true image of the original is thus obtained and is transferred by heating at 220° for 30 seconds and under a pressure of 1 to 2 kg/cm$^2$ from that intermediary support onto a final support made from a polyester web. A true reproduction of the original is thus obtained.

In the last transfer-step is repeated a second time, by doubling the duration time of the transfer, a second direct copy of the original is obtained, which is barely more pale than the first one.

EXAMPLE 2

If it is proceeded as in the example 1, but if a sheet of paper is used as intermediary support, which is coated with about 12 g/m$^2$ of a mix obtained as follow:

10 parts of an aqueous emulsion containing 50% of polystyrene are mixed with 90 parts of a solution containing 12% of polyvinylalcohol and 2,2% of a finaly powdered urea-formaldehyd condensation product (PERGOPAK M of Ciba-Geigy) in a liquid constituted by 50 parts water for 50 parts ethanol.

By a double transfer as described in Example 1, a direct image of the original is thus obtained on a polyester web.

A good color image is also obtained when a film made of polyethylene terephthalate or a plate coated with an epoxy resin is used as final support instead of a polyester web.

EXAMPLE 3

In a customary photocopying device (for example a 3 M 391) three copies are effected which correspond to the color selections (yellow, magenta and cyan) of the original. They are effected onto zinc oxide paper with magnetic developers containing 3'-hydroxyquinophthalone (as yellow dyestuff), 1-amino-2-phenoxy-4-hydroxy-anthraquinone (as magenta dyestuff) and 1-amino-4-isopropylamino-5,8-dihydroxyanthraquinone (as cyan dyestuff).

These copies are sucessively transferred after having been superposed in registration on a non-woven of polyamide. The yellow copy is first transferred, then the magenta copy and at last the cyan copie, all these transfers being effected by heating during 20 seconds at 200°, on a customary press, in which a good contact is achieved between the non-woven and the copy under a pressure of 1 to 2 kg/cm$^2$.

The inversed image thus obtained is then transferred by heating during 30 seconds at 210°, from the intermediary support to the final support made of a polyester web, under a pressure of 1 to 2 kg/cm$^2$. A true reproduction of the original is thus obtained. When all transfers are repeated a second time with the same three copies (yellow, magenta and cyan), by rawing the duration of the transfer of 5 to 15 seconds, a further multicolored copy of the original is obtained, which is barely paler than the first copy.

EXAMPLE 4

A strip of paper weighing 80g/m$^2$ is coated with about 8 g/m$^2$ of the easy to spread, following composition: 100 parts of an emulsion of acrylic resin (ACRONAL 230 D of BASF) and 5 parts of an urea formaldehyde condensation product PERGOPAK M of Ciba-Geigy), and dried. When said paper strip is used as intermediary support as disclosed in Examples 1 and 3, very good color images are obtained.

EXAMPLE 5

A sheet of paper is coated with about 10 g/m$^2$ of the following mixture:

1,6 parts of paraffine
3,4 parts of an urea -formaldehyde condensation product (PERGOPAK M of Ciba-Geigy)
20,0 parts of polystyrene
75,0 parts of xylene.

The sheet is then dried. An inverse and multicolored image of an original is reconstituted thereon by successively transferring in registration thereon the tree copies (obtained on zinc oxide paper) of the color selections of said original. These transfers have been effected by heating during 30 seconds at 140° C.

Said intermediary image in then transferred onto one paper sheet, impregnated with polyethyleneglycol or on a paper sheet coated with polyethyleneglycol terephthalate or on a non-woven of polyamide or of polyester. Said transfer is conducted by heating at 215–220° during 30 seconds, and gives a very good direct copy of the original.

I claim:

1. Process for color-copying a colored original onto a final support damageable by repeated heatings between 130 and 230° C. which involves the color selections of said original by photocopying and developing each of said color selections with dry developers, characterized by the fact that said developers
    (a) contain dyestuffs which are sublimable or vaporizable between 130 and 230° C. and which correspond to the photocopied color selection,
    (b) that the dyestuffs contained in these copies are successively transferred by superposing them in registration onto an intermediary support, in order to reconstitute the inverse color image of the original, and
    (c) that said intermediate image is rightened by transferring it in only one heating-step on the final support.

2. Process according to claim 1, characterized by the use as intermediary support of a paper sheet impregnated with a solvent for the used dyestuffs.

3. Process according to claim 1, characterized by the use as an intermediary support of a paper sheet coated or impregnated with ethylcellulose or polyvinylalcohol containing silica, zinc oxide or other adsorbents.

4. Process according to claim 1, characterized by the use as intermediary support of a paper sheet coated or impregnated with polystyrene, epoxy resin, or acrylic resin.

5. Process according to claim 1, characterized by the use as intermediary support of a synthetic paper sheet.

6. Process according to claim 1, characterized by the use as intermediary support of a polyamide non-woven.

7. Process according to claim 1, characterized by photocopying the color selection onto a zinc oxide paper.

8. The color photocopies obtained by only one transfer step from an inverse color image of the original constituted by dyestuffs which are sublimable or vaporisable between 130 and 230° C.

9. The color photocopies obtained by a process according to claim 1.

10. Process according to claim 2, wherein said paper sheet is impregnated by polypropyleneglycol, polyethyleneglycol, an ester or ether of polyethyleneglycol or mixture thereof.

* * * * *

UNITED STATES PATENT AND TRADEMARK OFFICE
CERTIFICATE OF CORRECTION

PATENT NO. : 4,134,676
DATED : January 16, 1979
INVENTOR(S) : Wolfgang Mehl

It is certified that error appears in the above-identified patent and that said Letters Patent are hereby corrected as shown below:

Column 1, line 38, "equiping" should be --equipping--.

Column 1, line 42, "consits" should be --consists--.

Column 1, line 52, "transporses" should be --transposes--.

Column 1, line 61, "them" should be --then--.

Column 2, line 28, "coate" should be --coat--.

Column 2, line 34 "behave" should be --have--.

Column 2, line 42, "an" should be --and--.

Column 2, line 42, "hat" should be --that--.

Column 2, line 63, "none" should be --no--.

Column 3, line 47, "finaly" should be --finely--.

UNITED STATES PATENT AND TRADEMARK OFFICE
CERTIFICATE OF CORRECTION

PATENT NO. : 4,134,676
DATED : January 16, 1979
INVENTOR(S) : Wolfgang Mehl

It is certified that error appears in the above–identified patent and that said Letters Patent are hereby corrected as shown below:

Column 4, line 15, "rawing" should be --drawing--.

Column 4, line 40, "tree" should be --three--.

Signed and Sealed this

Twelfth Day of June 1979

[SEAL]

Attest:

RUTH C. MASON
*Attesting Officer*

DONALD W. BANNER
*Commissioner of Patents and Trademarks*